United States Patent
Felten et al.

(10) Patent No.: US 8,761,332 B2
(45) Date of Patent: Jun. 24, 2014

(54) DYNAMIC PRESCALING COUNTERS

(71) Applicant: Texas Instruments, Incorporated, Dallas, TX (US)

(72) Inventors: Lothar K Felten, Hauset (BE); Lars Lotzenburger, Erding (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/625,862

(22) Filed: Sep. 24, 2012

(65) Prior Publication Data

US 2014/0086378 A1    Mar. 27, 2014

(51) Int. Cl.
*G06M 3/00*    (2006.01)
(52) U.S. Cl.
USPC ............. 377/26; 377/44; 377/49; 377/51
(58) Field of Classification Search
None
See application file for complete search history.

(56) References Cited

U.S. PATENT DOCUMENTS

| | | | | |
|---|---|---|---|---|
| 3,906,456 | A | * | 9/1975 | Redifer ............................ 377/20 |
| 4,341,950 | A | * | 7/1982 | Kyles et al. ..................... 377/28 |
| 5,117,443 | A | * | 5/1992 | Shires ........................... 375/362 |
| 5,450,460 | A | * | 9/1995 | Stodieck ......................... 377/44 |
| 6,249,562 | B1 | * | 6/2001 | Wells .............................. 377/26 |
| 6,792,065 | B2 | * | 9/2004 | Maletsky ........................ 377/34 |
| 7,551,706 | B2 | * | 6/2009 | Takagi ............................ 377/26 |
| 7,688,465 | B2 | * | 3/2010 | Maeda ........................ 358/1.15 |
| 8,189,732 | B1 | * | 5/2012 | Melton et al. .................... 377/26 |
| 2004/0107377 | A1 | * | 6/2004 | Wells ............................. 713/500 |
| 2005/0117692 | A1 | * | 6/2005 | Hunter et al. ................... 377/15 |
| 2011/0103540 | A1 | * | 5/2011 | Wassermann ................... 377/26 |
| 2012/0230460 | A1 | * | 9/2012 | Vyssotski et al. .............. 377/26 |

* cited by examiner

*Primary Examiner* — Tuan T Lam
(74) *Attorney, Agent, or Firm* — John R. Pessetto; W. James Brady; Frederick J. Telecky, Jr.

(57) ABSTRACT

A prescaling counter includes a prescaling unit and a counter. The prescaling unit includes a programmable divider that is arranged to divide an event clock that includes signaled events to generate a prescaled clock in response to a prescaling value. The counter includes a register that includes a lower count register and an upper count register for generating a count result. The counter is arranged to increment the lower count register in response to the prescaled clock and to increment the upper count register in response to a terminal condition in the lower count register. The prescaling value is generated in response to the upper count register.

20 Claims, 3 Drawing Sheets

DYNAMIC PRESCALING COUNTERS

BACKGROUND

Counters are used to count events for processes that are being monitored. The occurrence of an event causes a "tick" on an event clock signal that is counted by a counter. The final count of ticks in the counter is used for purposes such as data logging, control, diagnostics and the like. Exceeding the counting range of the counter causes counter overflow, which can often lead to loss of data from the counter. The incidence of overflow conditions can be reduced by using a larger counter: however, the larger counter typically consumes more layout area and power, and can slow the maximum speed of operation of the counter. The incidence of overflow can be also reduced by using a prescaler to reduce the number of ticks presented to the counter.

Counter prescalers are typically dividers used to scale the event clock input of a counter, which uses the existing range of the counter to count more clicks (indications) although at the expense of reducing precision. The prescalers typically have a "divide by" value that is selected such that the expected amount of counted events does not exceed the counting range of the counter. When the nature and expected frequency of events is known beforehand, a prescaler can be set such that counter overflows are typically avoided. However, in many situations that the nature and expected frequency of events can vary considerably from what is expected, and the prescaler is often set to a non-optimum value so as to avoid loss of data (at the expense of precision, for example). If the prescaler value is set too low, a counter overflow may occur. If the prescaler value is set too high, the final count of the counter might not have sufficient precision to provide meaningful data in some applications.

SUMMARY

The problems noted above are solved in large part by a counter that gradually increases the amount of prescaling used as the number of ticks (indications of events) conveyed by an event clock signal rises. As disclosed herein, a dynamic prescaling counter is arranged to count events generated by processes. The range of possible final counts spans a very wide range of useful click totals because, as arranged, the prescaling of the dynamic prescaling counter is dynamically scaled in response to the input count. The dynamic prescaling counter can be implemented in hardware such that very high clock speeds can be attained. The dynamic prescaling counter also can function without the use of processor logic (such as CPU, bus-mastering direct-memory access, interrupt service routines, and the like).

The prescaling counter typically includes a prescaling unit and a counter. The prescaling unit includes a programmable divider that is arranged to divide an event clock that includes indications of signaled events to generate a prescaled clock in response to a prescaling value. The counter includes a register that includes a lower count register and an upper count register for generating a count result. The counter is arranged to increment the lower count register in response to the prescaled clock and to increment the upper count register in response to a terminal condition in the lower count register. The prescaling value is generated in response to the upper count register.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component. Accordingly, distinctions are not necessarily made herein between components that differ in name but not function. In the following discussion and in the claims, the terms "including" and "comprising" are used in an open-ended fashion, and thus are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections.

Figure 1:
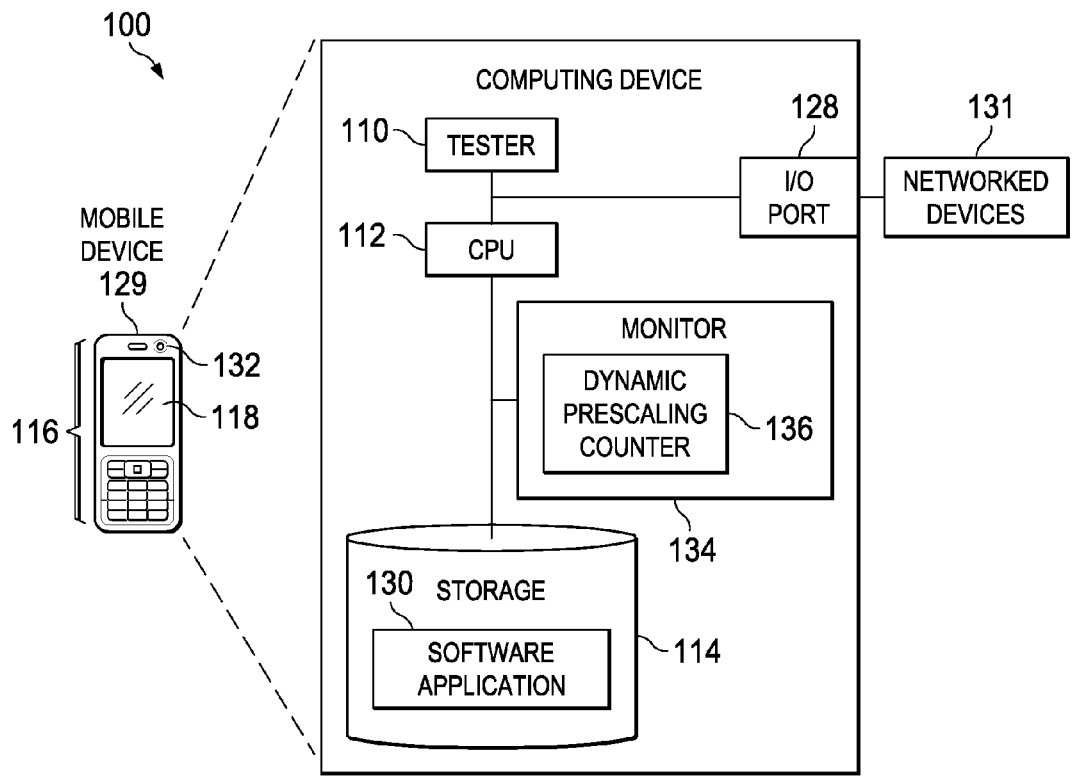
FIG. 1 shows an illustrative computing device in accordance with preferred embodiments of the disclosure.

FIG. 1 shows an illustrative computing device 100 in accordance with preferred embodiments of the disclosure. For example, the computing device 100 is, or is incorporated into, a mobile communication device 129, such as a mobile phone, a personal digital assistant, a personal computer, automotive electronics, projection (and/or media-playback) unit, or any other type of electronic system.

In some embodiments, the computing device 100 comprises a megacell or a system-on-chip (SoC) which includes control logic such as a CPU 112 (Central Processing Unit), a storage 114 (e.g., random access memory (RAM)) and tester 110. The CPU 112 can be, for example, a CISC-type (Complex Instruction Set Computer) CPU, RISC-type CPU (Reduced Instruction Set Computer), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100. The CPU 112 can include (or be coupled to) monitor 134, which is arranged in a common (or separate) substrate. Monitor 134 is arranged to monitor and/or control a process and includes a dynamic prescaling counter 136 that is arranged to count events of the process.

The tester 110 is a diagnostic system and comprises logic (embodied at least partially in hardware) that supports monitoring, testing, and debugging of the computing device 100 executing the software application 130. For example, the tester 110 can be used to emulate one or more defective or unavailable components of the computing device 100 to allow verification of how the component(s), were it actually present on the computing device 100, would perform in various situations (e.g., how the components would interact with the software application 130). In this way, the software application 130 can be debugged in an environment which resembles post-production operation.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, image projector 132, and the like. The input is received using audio and/or video inputs (using, for example, voice or image recognition), and mechanical devices such as keypads, switches, proximity detectors, and the like. The CPU 112 and tester 110 is coupled to I/O (Input-Output) port 128, which provides an interface (that is configured to receive input from (and/or provide output to) peripherals and/or computing devices 131, including tangible media (such as flash memory) and/or cabled or wireless media (such as a Joint Test Action Group (JTAG) interface). These and other input and output devices are selectively coupled to the computing device 100 by external devices using wireless or cabled connections.

As disclosed herein, a dynamic prescaling counter 136 is arranged to count events generated by processes. The dynamic prescaling counter 136 spans a very wide range of useful event totals because, as arranged, the scaling of the dynamic prescaling counter 136 is determined in response to the input count (as compared with the oftentimes faulty expectations and/or assumptions used to select a prescaler value, for example). The dynamic prescaling counter 136 can be implemented in hardware such that (relative to software implementations) very high clock speeds can be attained. The dynamic prescaling counter 136 also can function without the use of processor logic (such as CPU, bus-mastering direct-memory access, interrupt service routines, and the like).

Figure 2:
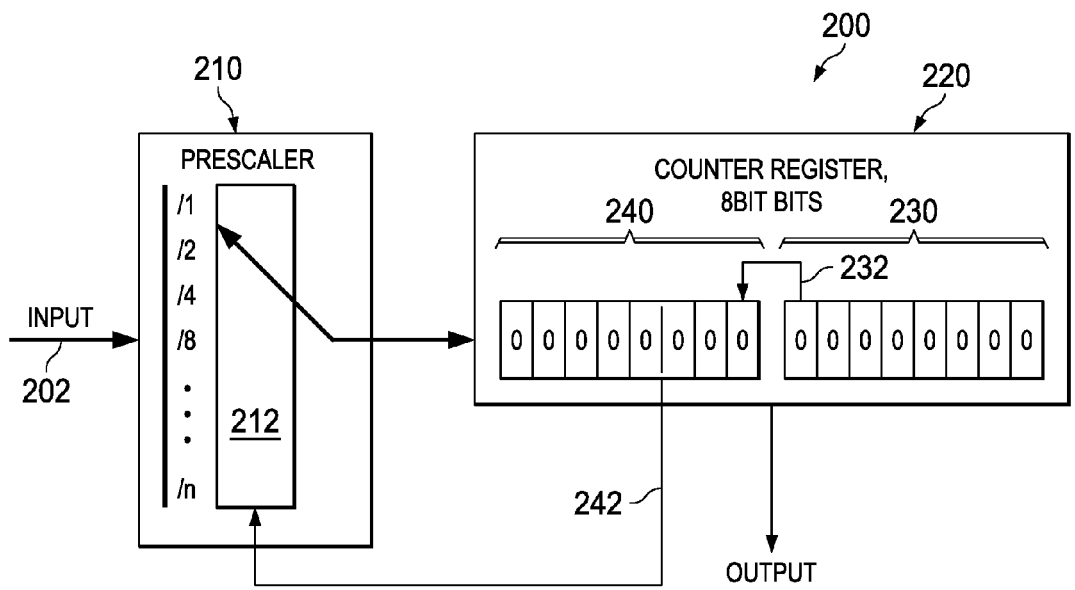
FIG. 2 is a logic diagram illustrating a dynamic prescaling counter in an initial condition in accordance with preferred embodiments of the disclosure.

FIG. 2 is a logic diagram illustrating a dynamic prescaling counter in an initial condition in accordance with preferred embodiments of the disclosure. Dynamic prescaling counter 136 includes a prescaler 210 and counter 220. The input of prescaler 210 is coupled to an event clock signal. The output of prescaler 210 is coupled to a clock input of counter 220. Counter 220 includes a lower count register 230 and an upper count register 240. State 200 illustrates the values used for initialization, where both the lower count register 230 and the upper count register 240 are initialized to an initial count of zero, and the prescaler 210 is initialized to divide by the value of one.

The lower count register 230 and the upper count register 240 are arranged as a register to hold the current value of the count of the counter 220. The lower count register 230 is arranged to count each event output by the prescaler 210 (via prescaled clock signal 244) and to signal the upper count register 240 (via terminal count signal 232) when the lower count register 230 reaches a terminal condition (such as a rollover condition as discussed below with respect to FIG. 3). The upper count register 240 is arranged to count the number of times the lower count register (for example) encounters a terminal condition. In addition, the upper count register 240 is arranged to provide a prescaler value for the prescaler 210 (via prescaler feedback signal 242). In an embodiment, the upper count register 240 is arranged to provide (via prescaler feedback signal 242) a prescaler value from which the prescaler value is determined.

In operation, prescaler 210 is arranged receive an event clock signal that conveys information signaling the occurrence of events. Prescaler 210 is a programmable divider that is arranged to divide the number of signaled events of the counter input signal 202 in accordance with a prescaling value that is selected by the selector 212. The selector 212 selects the prescaling value in accordance with the upper count register 240, which is used to determine a prescaler value.

In an exemplary embodiment, the prescaling value is the value of resulting from using the upper count register as an exponent having a base of two. Thus, the initial value of the upper count register 240 having a value of zero results in a prescaler value of one (two being raised to the power of zero equals one) being selected such that the number of events indicated on the input signal is divided by one (such that the prescaler passes one event indication for every event indication received).

Accordingly, during successive signaled events, the lower count register 230 is incremented for every event indicated by prescaler signal 244. The lower count register 230 is incremented for every event indicated by prescaler signal 244 until a terminal condition for the lower count register 230 is reached (as discussed below with reference to FIG. 3).

In various embodiments, different numbering systems can be used—such as two's complement—to represent internal clock values. In some numbering systems, the counter can be decremented in response to a clock to produce an accurate count value of clock events. Thus, the term "increment" can encompass the meaning of decrement when counting clock transitions, for example.

Figure 3:
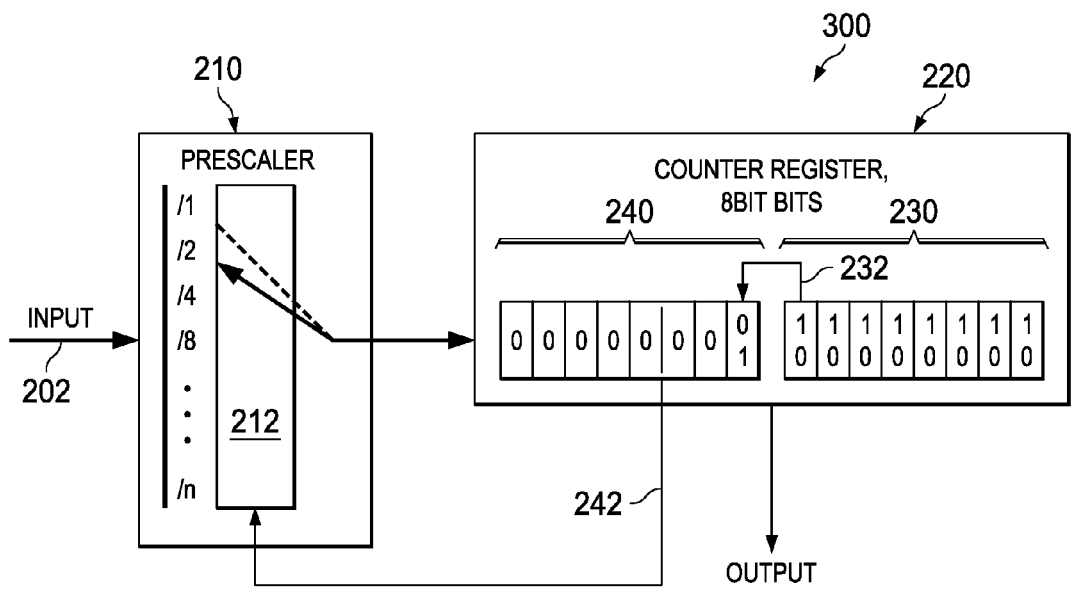
FIG. 3 is a logic diagram illustrating a dynamic prescaling counter in a lower count register rollover condition in accordance with preferred embodiments of the disclosure.

FIG. 3 is a logic diagram illustrating a dynamic prescaling counter in a lower count register rollover condition in accordance with preferred embodiments of the disclosure. State 300 represents a state where the lower count register 230 has been incremented for every event indicated by prescaler signal 244 until a terminal count condition (e.g., where every bit in the lower count register 230 is set to a logic one) has been reached. A rollover condition for the lower count register 230 occurs at the next event indicated by prescaler signal 244. When the rollover condition occurs, the lower count register 230 is incremented such that all (e.g., eight) bits in the lower count register 230 "roll over" to zeros and a carry out condition (via terminal count signal 232) is asserted.

When the carry out condition (via terminal count signal 232) is asserted, the upper count register 240 is incremented (e.g., changed from a value of zero to a value of one). Because the value of the upper count register 240 is used to provide a prescaler value for the prescaler 210 (or to provide a prescaler value from which the prescaler value is determined), the value of upper count register 240 is coupled to the selector 212 of prescaler 210.

In an exemplary embodiment, the value in upper count register 240 (after the first indication of a rollover by the lower count register 230 is received) is one, which when used as an exponent of the base two, yields a value of two. Thus, the selector 212 of prescaler 210 reconfigures the prescaler 210 to function as a "divide by two" counter. Accordingly, during every other successive signaled event, prescaler signal 244 is asserted such that the lower count register 230 is incremented every other successive event in the event clock signal.

After each successive terminal event is encountered, the selector 212 of prescaler 210 uses the newly incremented value of the upper count register 240 to generate a new prescaling value. Each new prescaling value is greater than the immediately preceding prescaling value. Thus, the series of prescaling values can be a geometrically increasing series, such as a series that includes (the initial portion of) the powers of two.

Figure 4:
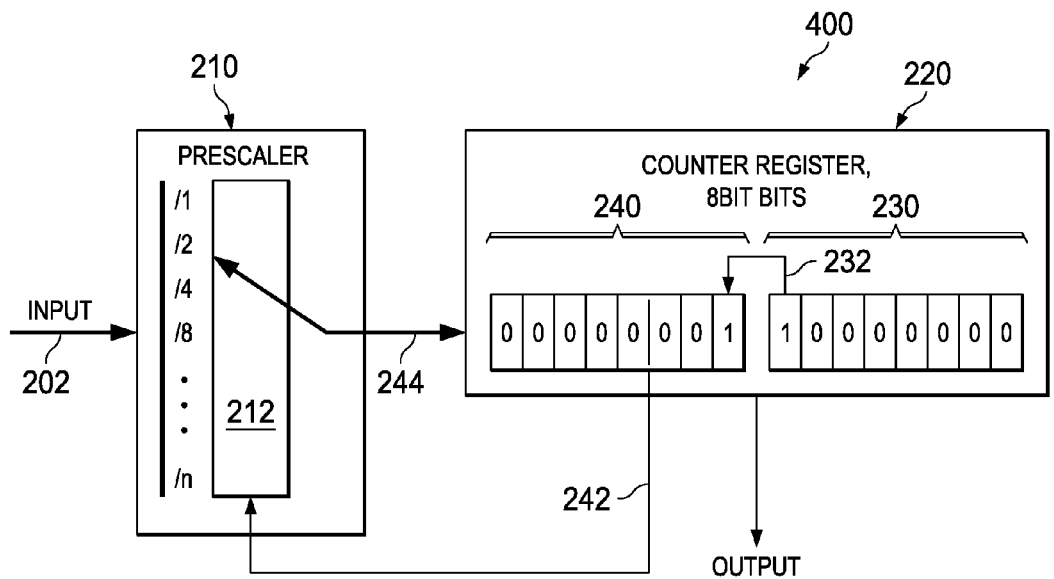
FIG. 4 is a logic diagram illustrating a dynamic prescaling counter having a normalized lower count register after a rollover condition in accordance with preferred embodiments of the disclosure.

FIG. 4 is a logic diagram illustrating a dynamic prescaling counter having a normalized lower count register after a rollover condition in accordance with preferred embodiments of the disclosure. State 400 represents a state where the lower count register 230 has been normalized by setting the lower count register 230 to a value that is around half of the maximum total count achievable by the lower count register 230. The lower count register 230 is incremented in response to each tick of the prescaler signal 244, where the lower count register 230 is incremented starting initially from the normalized value. (When each successive next rollover condition occurs, the lower count register 230 is again normalized.)

In an exemplary embodiment, the highest order bit of the lower count register is set after a rollover condition occurs, such that the lower count register is set to a "half-full" condition in response to a rollover condition. The normalization of the contents of the lower count register 230 from having an initial value of zero to being half-full is performed, for example, to minimize quantization errors when the selector 212 of the prescaler 210 is set to "divide by" values that are greater than or equal to two. When the above described normalization routine is used, the absolute error function can be described as: $(2^{\wedge}prescaler)/2$.

Figure 5:
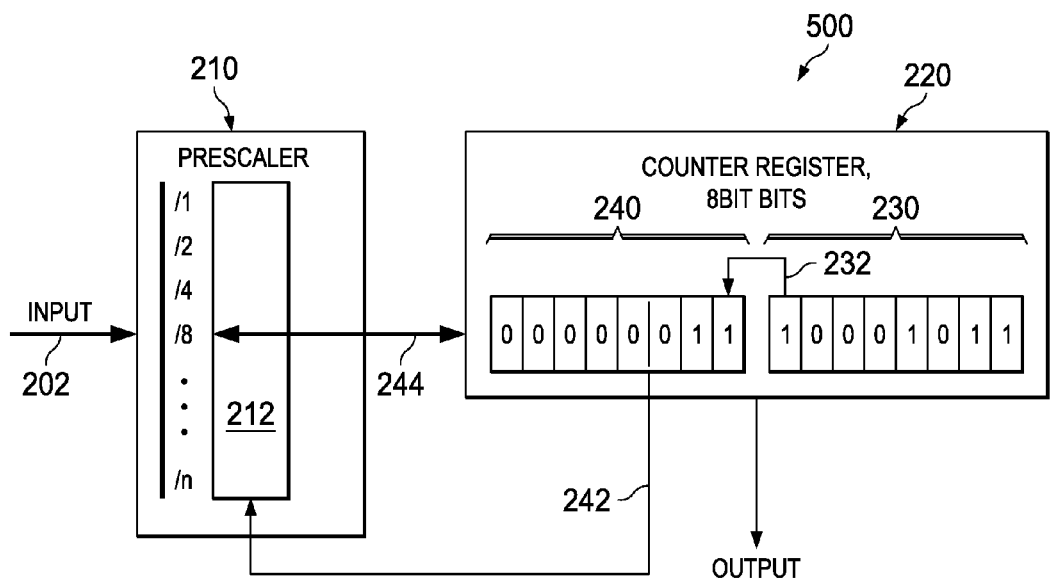
FIG. 5 is a logic diagram illustrating a dynamic prescaling counter having a prescaler in a "divide by eight" state in accordance with preferred embodiments of the disclosure.

FIG. 5 is a logic diagram illustrating a dynamic prescaling counter having a prescaler in a "divide by eight" state in accordance with preferred embodiments of the disclosure. State 500 represents a state where the lower count register 230 has been incremented 11 times (0x0B times). After normalization of the lower count register 230 (by setting the most significant bit, for example), the lower count register 230 has a value of 0x1B. The upper count register 240 has a value of three, which indicates that a rollover condition for the lower count register 230 has occurred three times. Thus, the value of the upper count register 240 having a value of three results in a prescaler value of eight (two being raised to the power of three equals eight) being selected such that the number of events indicated on the event clock signal is divided by eight.

The value of counter 220 can be read by reading the values of the lower count register 230 and the upper count register 240. When the value of the upper count register 240 is zero, no rollover event (or normalization) has occurred, and the value of the lower count register 230 can be interpreted exactly without modification.

When the value of the upper count register 240 is one or greater, the value of the lower count register 230 and the upper count register is numerically adjusted to provide a value for the counter 220 (which provides an approximate number for the number of event ticks encountered). The approximate number of event ticks encountered in the event clock signal can be estimated in accordance with the following function: $(1<<prescaler)*count$, where "count" is the value of the lower count register 230. Thus, when a value of three is used for the upper count register 240 (prescaler) and the value of 0x8B is used for the lower count register 230, the multiplication of 8 by 139 yields (the approximate number of ticks as being) 1112.

The counter 220 can be reset after reading the upper and lower count registers, which lowers the absolute error of the next approximation for the number of event ticks encountered over the period in which the counter 220 is counting events. The absolute error of the next approximation is lowered (or tends to be lowered) because resetting the counter 220 lowers the prescaler value that is used to determine the absolute error function.

In contrast, not reading (and not resetting) the counter 220 allows for substantially longer delays of service routines that would be required to service the counter (before an overflow would otherwise occur, for example). However, not servicing the counter 220 tends to reduce the accuracy (and/or precision) that would otherwise be achieved by virtue of reducing the prescaler value.

Code for the CPU 112 to implement an embodiment of the dynamic prescaling counter can be expressed as follows:

```
int main(void)
{
For (clock=0; clock<max; clock++)
{
//prescaler code
prescaler_counter++;
if (prescaler_counter==(1ull<<prescaler))
{
   counter++;
   prescaler_counter=0;
}
//counter code
if (counter&0xFF==0x00)
{//if counter wrapped to 0x100 . . .
   counter=0x80; // . . . set counter to 0x100/2 . . .
   prescaler++; // . . . and increment prescaler
}
}
}
```

Figure 6:
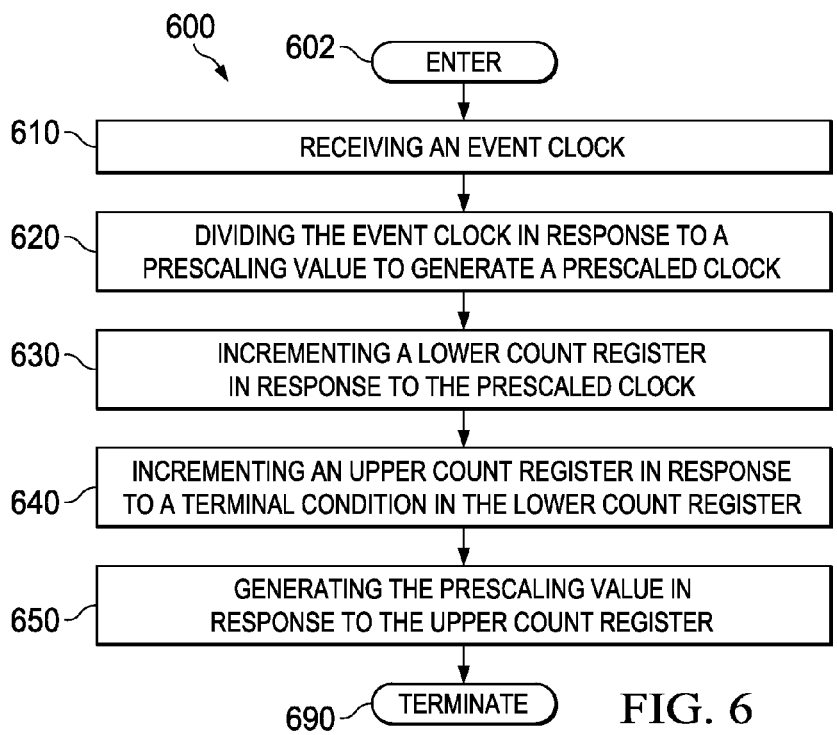
FIG. 6 is a flow diagram illustrating dynamic prescaling counting in accordance with preferred embodiments of the disclosure.

FIG. 6 is a flow diagram illustrating dynamic prescaling counting in accordance with preferred embodiments of the disclosure. Although the process 600 is described in terms of using a dedicated processor to count events generated by processes, the dynamic prescaling counter also can function with or without the use of processor logic (such as CPU, bus-mastering direct-memory access, interrupt service routines, and the like). The dynamic prescaling counter can be implemented in hardware such that very high clock speeds can be attained and/or in various combination of software and hardware.

The program flow is initiated at enter node 602 and proceeds to operation 610.

In operation 610, an event clock is received that includes indications of signaled events. The event clock is typically generated by a process that is being monitored by the system upon which the program flow is executing. Program flow continues in operation 620.

In operation 620, the event clock is divided in response to a prescaling value to generate a prescaled clock. The prescaling value is provided as a "feedback" value based upon the number of prescaled clock events that have already been generated. For example, if the prescaler value is three, every eighth signaled event generates a prescaled clock event. Program flow continues in operation 630.

In operation 630, a lower count register is incremented in response to the prescaled clock. For example, every prescaled clock event causes the lower count register to count (by increments of one, for example) until a terminal condition (such as a terminal count or a rollover condition) is reached. Program flow continues in operation 640.

In operation 640, An upper count register is incremented in response to a terminal condition in the lower count register. Thus, each terminal condition encountered causes a corresponding rise in the prescaler value. For example, each successive corresponding rise is an exponential increase over the previous corresponding rise. Also, the lower count register can be normalized in response to the terminal condition (which, for example, tends to minimize the result of the absolute error function of the count estimation). The lower count register can be normalized, for example, by setting the most significant bit of the lower count register. Program flow continues in operation 650.

In operation 650, the prescaling value is generated in response to the current value of the upper count register. As discussed above, prescaling value is provided as a "feedback" value based upon the number of prescaled clock events that have already been generated. The contents of the upper count register are effectively raised as a power of two to determine the current division rate (e.g., divide by one, divide by two, divide by four, divide by eight, and division of other powers of two). The prescaler value can be stored as either the input to the exponential function or as the result of the function.

Operation 650 can also include notifying a processor, for example, that a terminal condition has been reached in the lower count register. In response the processor can increment an internal counter from which the prescaler value can be determined. The internal counter, for example, can include the information of the upper count register (thus obviating the need for the "external" upper count register). The processor can then program the new prescaler value into a prescaler used to generate the prescaled clock. Program flow continues to node 690 where the process to is terminated.

Operation 650 can also include using a processor, for example, to determine an approximation of the signal events. The approximation can be determined in accordance with the equation (1<<prescaler)*count, where "count" is the value of the lower count register 230 and "prescaler" is the value of the upper count register 240. The approximation has an absolute error function of (2^prescaler)/2 when the lower count register 230 is normalized after a terminal condition (such as a rollover condition) is encountered.

Operation 650 can also include using a processor, for example, to reset the counter 220 after reading the contents of the lower count register 230 and the contents of the upper count register 240. Resetting the counter 220 lowers the value of the prescaler 210 selector 212 to a divide by one divider, which increases the accuracy of an approximation of the subsequently counted signal events.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A prescaling counter, comprising
a prescaling unit that includes a programmable divider that is arranged to divide an event clock that includes signaled events to generate a prescaled clock in response to a prescaling value; and
a counter having a register that includes a lower count register and an upper count register for generating a count result, wherein the counter is arranged to increment the lower count register in response to the prescaled clock, wherein the counter arranged to increment the upper count register in response to a terminal condition in the lower count register; and wherein the prescaling value is generated in response to the upper count register.

2. The device of claim 1, wherein the prescaling value is generated in response to an exponentiation function that uses the upper count register as input to the exponentiation function.

3. The device of claim 1, wherein the counter is arranged to normalize the lower count register in response to the terminal condition.

4. The device of claim 3, wherein the lower count register is normalized by setting a value of the lower count register to around half of the maximum total of the lower count register.

5. The device of claim 4, wherein the count result is obtained before an occurrence of the terminal condition by reading the lower count register.

6. The device of claim 4, wherein the count result is obtained after an occurrence of the terminal condition by reading the lower count register and the upper count register.

7. The device of claim 6, the count result is obtained after the occurrence of the terminal condition by multiplying the lower count register with a result of applying an exponentiation function to the upper count register.

8. The device of claim 7, wherein the exponentiation function is arranged to shift a set bit in the prescaler by a number of times that is indicated by the upper count register.

9. The device of claim 8, wherein the count result is an approximation of the total number of signaled events.

10. The device of claim 9, wherein count result has an absolute error that is determined in accordance with the function: absolute error function can be described as (2^prescaler)/2, where prescaler is the value of the upper count register.

11. A prescaling system, comprising
a processor that is arranged to monitor a process by evaluating signaled events generated by the process;
a prescaling unit that includes a programmable divider that is arranged to divide an event clock that includes indications of the signaled events to generate a prescaled clock in response to a prescaling value; and
a counter having a register that includes a lower count register and an upper count register for generating a count result, wherein the counter is arranged to increment the lower count register in response to the prescaled clock, wherein the counter arranged to increment the upper count register in response to a terminal condition in the lower count register; and wherein the prescaling value is generated in response to the upper count register.

12. The system of claim 11, wherein the prescaling value is generated in response to an exponentiation function that uses the upper count register as input to the exponentiation function.

13. The system of claim 12, wherein the terminal condition is a rollover condition.

14. The system of claim 11, wherein the processor is arranged to determine the count result by multiplying the lower count register with a result of applying an exponentiation function to the upper count register.

15. The system of claim 14, wherein the count result is an approximation of the total number of signaled events having an absolute error that is determined in accordance with the function: absolute error function can be described as (2^prescaler)/2, where "prescaler" is the value of the upper count register.

16. A method, comprising
receiving an event clock that includes indications of signaled events;
dividing the event clock in response to a prescaling value to generate a prescaled clock;
incrementing a lower count register in response to the prescaled clock;
incrementing an upper count register in response to a terminal condition in the lower count register; and
generating the prescaling value in response to the upper count register.

17. The method of claim 16, wherein the prescaled value is generated in response to an exponentiation function that uses the upper count register as input to the exponentiation function.

18. The method of claim 17, wherein the terminal condition is a rollover condition.

19. The method of claim 16, comprising generating a count result after an occurrence of the terminal condition by multiplying the lower count register with a result of applying an exponentiation function to the upper count register.

20. The method of claim 19, wherein the count result is an approximation of the total number of the signaled events having an absolute error that is determined in accordance with the function: absolute error function can be described as (2^prescaler)/2, where "prescaler" is the value of the upper count register.

* * * * *